(12) United States Patent
Van De Rijdt

(10) Patent No.: US 7,741,939 B2
(45) Date of Patent: Jun. 22, 2010

(54) DISPLACEMENT DEVICE AS WELL AS A COMPONENT PLACEMENT DEVICE

(75) Inventor: Johannes Hubertus Antonius Van De Rijdt, Gemert (NL)

(73) Assignee: Assembleon N.V., La Eindhoven (NL)

( * ) Notice: Subject to any disclaimer, the term of this patent is extended or adjusted under 35 U.S.C. 154(b) by 328 days.

(21) Appl. No.: 11/845,663

(22) Filed: Aug. 27, 2007

(65) Prior Publication Data

US 2008/0048812 A1  Feb. 28, 2008

(30) Foreign Application Priority Data

Aug. 28, 2006  (NL)  .................................... 1032371

(51) Int. Cl.
| | |
|---|---|
| H01F 7/00 | (2006.01) |
| H01F 1/00 | (2006.01) |
| H01F 3/00 | (2006.01) |
| B23P 19/00 | (2006.01) |
| H02K 41/02 | (2006.01) |
| H02K 33/00 | (2006.01) |
| H02K 35/00 | (2006.01) |

(52) U.S. Cl. ........................ 335/219; 335/229; 335/282; 335/296; 335/297; 335/298; 335/299; 335/302; 29/759; 310/12.06; 310/12.15; 310/15

(58) Field of Classification Search ................. 335/229, 335/282, 285, 296–299, 302; 29/740, 759, 29/741, 743; 310/12.06, 12.15, 12.22, 12.29, 310/12, 15, 30; 355/53, 72

See application file for complete search history.

(56) References Cited

U.S. PATENT DOCUMENTS

| 4,445,798 | A | * | 5/1984 | Munehiro | .................... 400/320 |
|---|---|---|---|---|---|
| 5,260,580 | A | * | 11/1993 | Itoh et al. | ................. 250/492.2 |
| 5,841,250 | A | * | 11/1998 | Korenage et al. | ........... 318/135 |
| 6,128,069 | A | * | 10/2000 | Korenaga | ..................... 355/53 |
| 6,163,091 | A | * | 12/2000 | Wasson et al. | ........... 310/12.19 |
| 6,189,875 | B1 | * | 2/2001 | Van Gastel | ................... 267/160 |
| 6,509,951 | B2 | * | 1/2003 | Loopstra et al. | ................ 355/30 |
| 2001/0039719 | A1 | * | 11/2001 | Van De Rijdt | ................. 29/740 |
| 2002/0039179 | A1 | * | 4/2002 | Tanaka | .......................... 355/53 |
| 2003/0007140 | A1 | * | 1/2003 | Korenaga | ..................... 355/72 |
| 2004/0245861 | A1 | * | 12/2004 | Miyajima et al. | ............. 310/12 |
| 2006/0072098 | A1 | * | 4/2006 | Dams | ........................... 355/72 |

FOREIGN PATENT DOCUMENTS

EP  0951664  10/1999

* cited by examiner

*Primary Examiner*—Lincoln Donovan
*Assistant Examiner*—Mohamad A Musleh
(74) *Attorney, Agent, or Firm*—Foley & Lardner LLP

(57) ABSTRACT

A displacement device is provided with a linear motor which comprises a first part comprising magnetic strips and a second part comprising a coil block. The parts are connected via a linear guide. The second part is movable with respect to the first part in a conveying direction extending parallel to the guide. The displacement device further comprises an connected to said second part, which is located on a side of the first part remote from the second part. The displacement device can be used is a component placement device.

7 Claims, 3 Drawing Sheets

DISPLACEMENT DEVICE AS WELL AS A COMPONENT PLACEMENT DEVICE

BACKGROUND OF THE INVENTION

The invention relates to a displacement device provided with a linear motor which comprises a first part comprising magnetic strips and a second part comprising a coil block, which parts are connected via a linear guide, with the second part being movable with respect to the first part in a conveying direction extending parallel to the guide.

The invention also relates to a component placement device comprising an X-beam extending in the X-direction, at least one component pickup and placement unit, which is movable with respect to the X-beam, a first Y-beam extending in the Y-direction, a first slide, which is movable with respect to said first Y-beam, a second Y-beam extending parallel to said first Y-beam, a second slide, which is movable with respect to the second beam, the first end of the X-beam being connected to the first slide and the second end of the X-beam being connected to the second slide, in such a manner that the X- and Y-beams are arranged in an H-configuration, said component placement device further comprising drive units for independently driving the slides with respect to the Y-beams.

A coil block usually comprises a metal core comprising a tin package and coils wound around said core.

The coils of such a displacement device, which is known per se, are provided with current, generating magnetic fields which interact with said magnetic strips, as a result of which a movement of the second part comprising the coil block with respect to the first part comprising the magnetic strips is realised. Either the first part or the second part may be disposed in a stationary position. The first and the second part are connected via a linear guide, which guide keeps the first and the second spaced from each other, so that an air gap is present between the first part and the second part. As a result of attractive forces between the magnetic strips and the coil block, comparatively large forces are exerted on said guide. Said static forces are mainly caused by the force of attraction between the metal core and the magnetic strips. The dynamic magnetic forces between the coils and the magnetic strips are relatively small in comparison with said static forces.

In order to be able to withstand said static forces, the guide must be of comparatively robust construction.

SUMMARY

The object of the invention is to provide a displacement device in which the forces exerted on the linear guide are comparatively limited.

This object is accomplished with the displacement device according to the invention in that the displacement device further comprises an elongated magnet connected to said second part, which is located on a side of the first part remote from the second part.

The elongated magnet exerts a magnetic force on said first part, said force being opposite to the magnetic force that is exerted on the first part by the second part.

The force exerted on the guide is of substantially the same magnitude as the difference between the forces exerted by the second part and the magnet. Said force exerted on the guide is significantly smaller than the force that would be exerted without the presence of the elongated magnet. This makes it possible to use a lighter construction of the guide, thereby enabling more rapid movements between the first part and the second part. In addition, the costs of such a guide are considerably lower, whilst its life span will be longer.

A similar reduction of forces on the guide is achieved when the first part is connected to the elongated magnet, in which case the elongated magnet will be located on a side of the second part remote from the first part One embodiment of the displacement device according to the invention is characterised in that the first part comprising magnetic strips is disposed in a stationary position.

The spacing between the magnet and the magnetic strips can be kept comparatively limited in that case, as a result of which a compact displacement device can be obtained. In addition, the length of the coil block thereof is comparatively small in comparison with the length of the track of magnetic strips.

Another embodiment of the displacement device according to the invention is characterised in that the elongated magnet is magnetised in a direction perpendicular to the conveying direction.

With such a direction of magnetising an effective reduction of the forces being exerted on the guide is achieved, whilst hardly any eddy currents caused by the elongated magnet will occur upon movement of the second part with respect to the first part, or vice versa.

The invention also relates to a component placement device as described above. Such a component placement device is known, for example from EP-B1-0 951 664. With such a component placement device it is important that the component pickup and placement unit can be moved relatively quickly and precisely in the X- and Y-directions. so that a comparatively large number of components can be picked up per unit time and be placed on, for example, a substrate with a high degree of precision. With the component placement device that is known from EP-B1-0 951 664, the beams and the slide are of comparatively heavy construction. As a result, relatively large forces occur during comparatively rapid movement of the slides.

The object of the invention is to provide a component placement device by means of which the placement of components can take place with a comparatively high degree of precision, whilst the component placement device may be of comparatively light construction.

This object is accomplished with the component placement device according to the invention in that the displacement device further comprises an elongated magnet connected to said second part, which magnet is located on a side of the first part remote from the second part.

The magnet reduces the forces that are exerted on the guide, so that the guide may be of lighter construction.

BRIEF DESCRIPTION OF THE DRAWINGS

The invention will now be explained in more detail with reference to the drawings, in which.

DETAILED DESCRIPTION

Like parts are indicated by the same numerals in the figures

Figure 1:
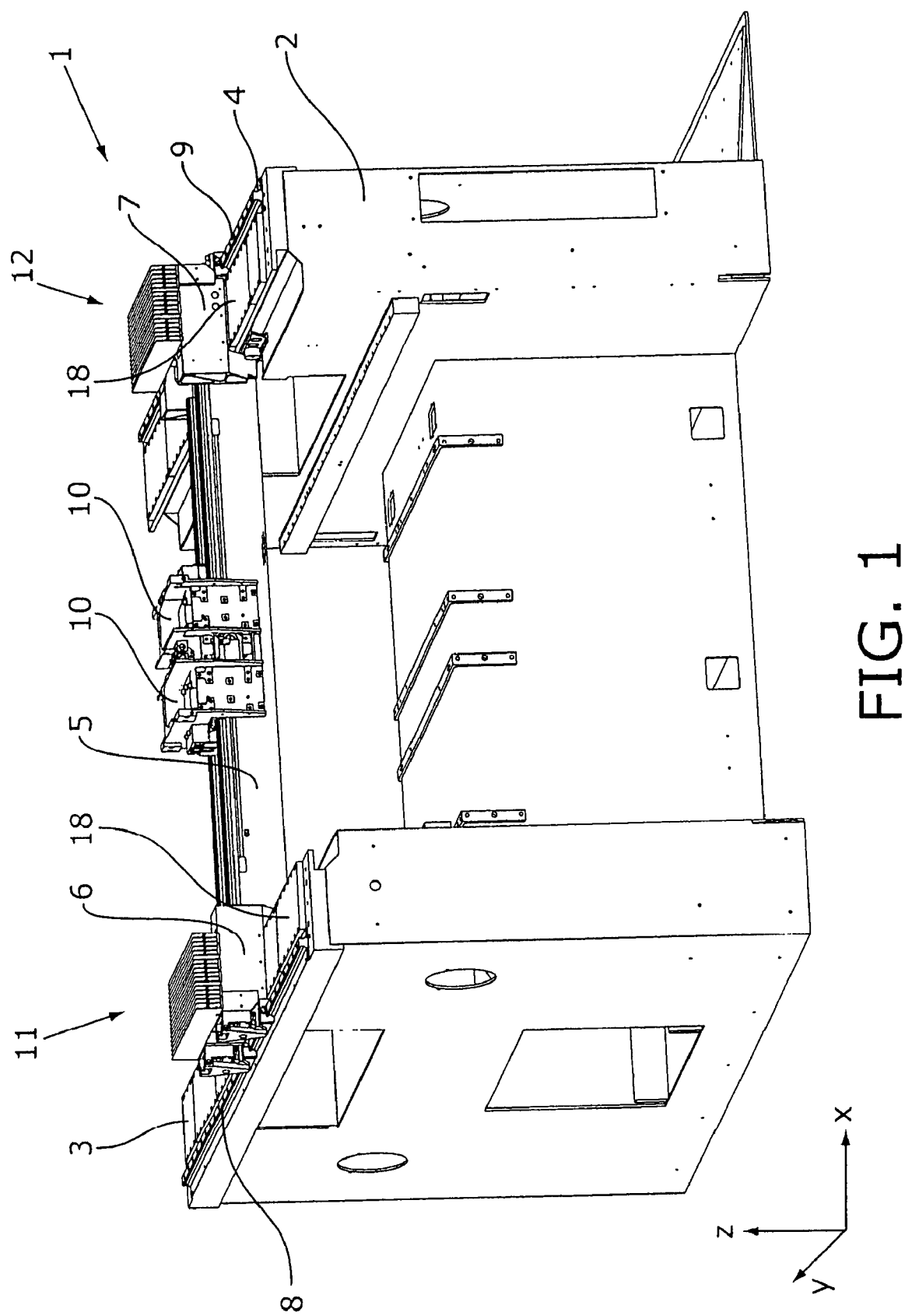
FIG. 1 is a perspective view of a component placement device according to the invention.
Figure 2:
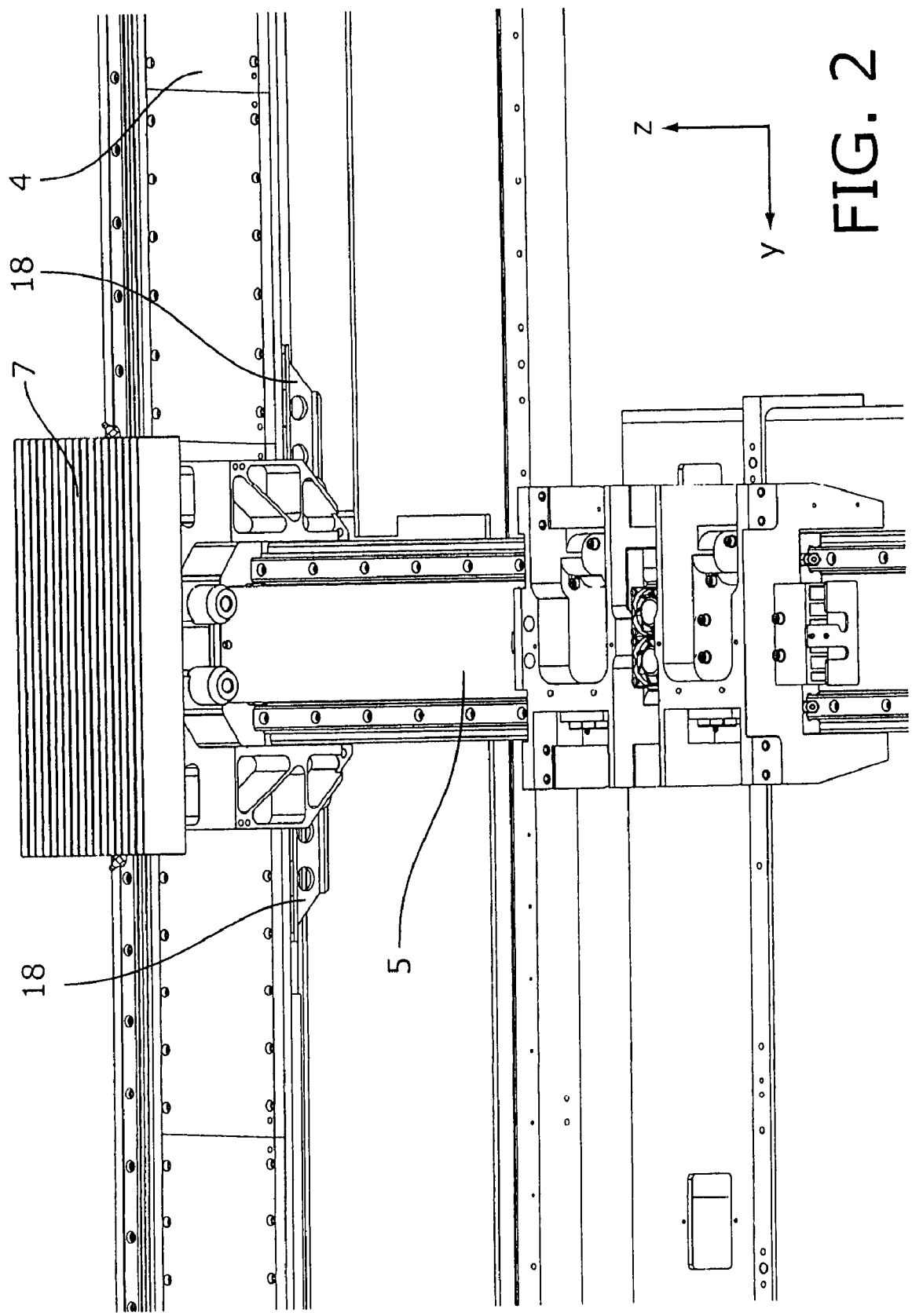
FIG. 2 is a side view in the X-direction of a part of the device is shown in FIG. 1.
Figure 3:
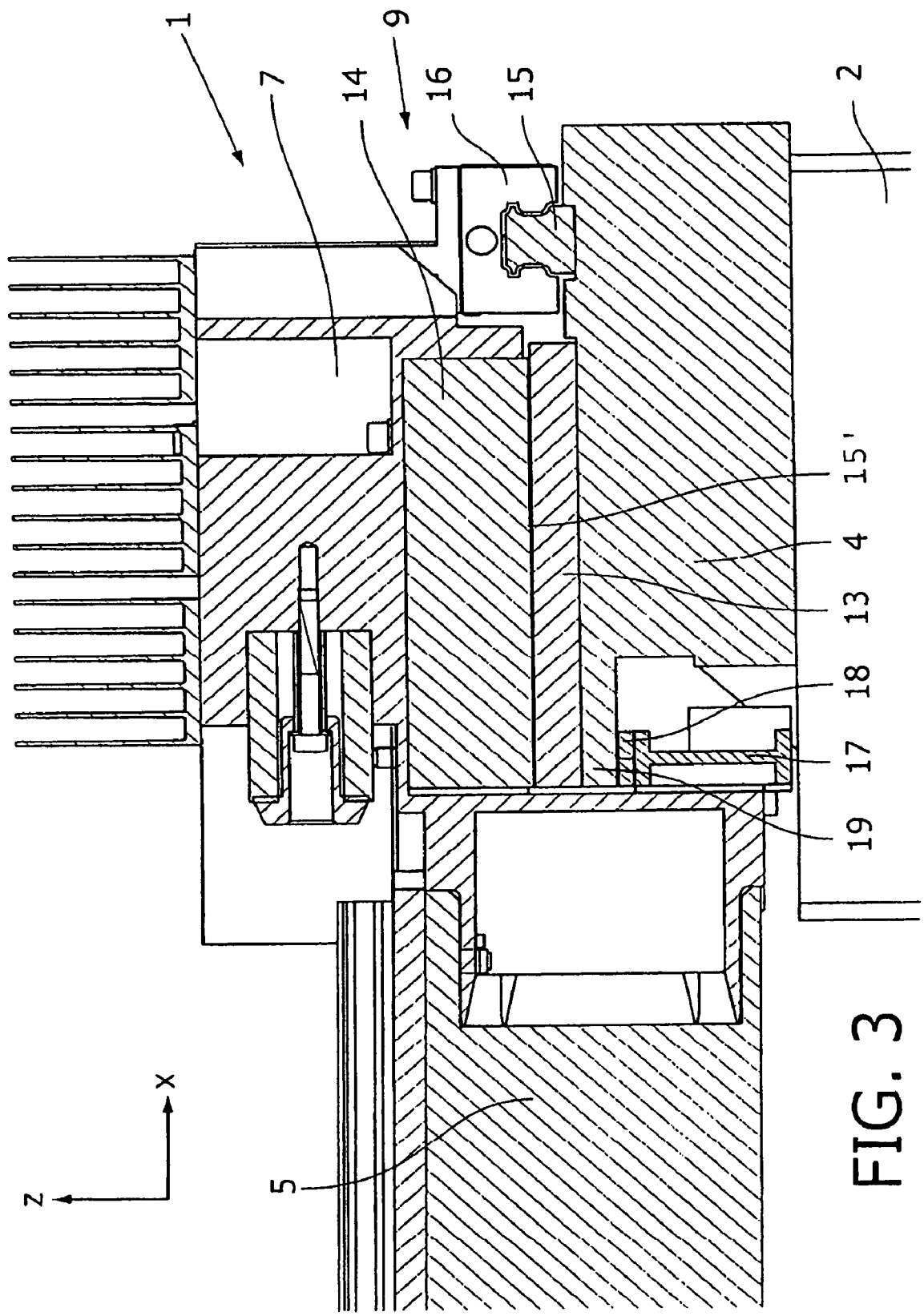
FIG. 3 is a cross-sectional view in the Y-direction of a part of the device is shown in FIG. 1.

FIG. 1 shows a component placement device 1, which comprises a frame 2. The frame 2 is on either side thereof provided with Y-beams 3, 4 extending parallel to each other in the Y-direction. An X-beam 5 extends between the Y-beams 3, 4. The Y-beams 3, 4 and the X-beam 5 form an H-configuration. Both ends of the X-beam 5 are connected to slides 6, 7, which are supported, being movable in the Y-direction, on the Y-beams 3, 4 via guides 8, 9. The X-beam 5 is provided with two component pickup and placement units 10, which are jointly movable in the X-direction. Each component pickup and placement unit 10 is provided with a nozzle (not shown) which is movable in the Z-direction, by means of which components can be picked up from a pickup position and subsequently be placed on a substrate in a manner that is known per se. The component placement device 1 as described so far is known per se and is discussed. in a version comprising only one component pickup and placement unit 10, in the aforesaid European patent EP-B1-0 951 664 in the name of the present applicant.

The component placement unit 1 according to the invention is further provided with a drive unit for moving the component pickup and placement units 10 over the X-beam in the X-direction and in the opposite direction. The component placement device 1 further comprises two drive units 11, 12, which are each provided with a first part 13 comprising magnetic strips, which is connected to the Y-beam 3, 4. Each drive unit 11, 12 further comprises a second part 14 comprising a coil block, which is connected to the slide 6, 7. The second part 14 extends parallel to the first part 13, with an air gap 15' being present between the parts 13, 14. The second part 14 is connected to a power source for controlling and energizing the coils in the second part 14. The guides 8, 9 each comprise a section 15 extending in the Y-direction, which is connected to the Y-beam 3, 4, and a shoe 16 being movable over said section 15, in form-locked contact therewith, which is connected to the slide 6, 7.

Each slide 6, 7 further comprises an I-section 17 extending in the Y-direction and an elongated magnet 18 connected to said I-section 17. The magnet 18 is located on a side of the first part 13 remote from the second part 14, whilst furthermore a part 19 of the metal Y-beam 3, 4 is located between the first part 13 and the magnet 18. The magnetic strips are accurate connected to part 19. The magnet 18 is polarised in the Z-direction, one pole being located on a side facing towards the first part 13.

The magnet 18 generates a magnetic force, which attempts to move the slide 7 in the upward Z-direction. At the same time the coil block generates a magnetic force in the second part 14, which attempts to move the slide 7 in the downward Z-direction. The difference between the two forces generated by the magnet 18 and the second part 14, respectively, is exerted on the section 15 via the shoe 16. Since the guide 9 only needs to take up the difference between the forces rather than the entire force exerted by the second part 14, the guide 9 may be of comparatively light construction.

It is also possible to use the drive unit 11, 12 in other displacement devices by which a linear movement is carried out by means of a linear motor, which linear motor comprises a first part 13 comprising magnetic strips and a second part 14 comprising a coil block. By using the elongated magnet 18, the forces to be taken up by the guide are significantly reduced.

It is also possible, of course, to connect the first part 13 to the slide 7, whilst connecting the second part 14 to the beam 4. The magnet 18 will be located on a side of the second part 14 remote from the first part 13 in that case, whilst the magnet 18 will compensate the force exerted by the first part 13.

It is also possible to provide both the first part and the second part with an elongated magnet, in which case the two elongated magnets will repel one another. In this case, too, a reduction of the forces being exerted on the guide is achieved. The additional elongated magnet requires an additional investment in money and space, however.

The invention claimed is:

1. A displacement device provided with a linear motor which comprises a first part comprising magnetic strips and a second part comprising a coil block which parts are connected via a linear guide, with the second part being movable with respect to the first part in a conveying direction extending parallel to the guide, wherein the displacement device further comprises an elongated magnet connected to said second part, the elongated magnet being located on a side of the first part remote from the second part wherein at least a portion of the first part is located between the second part and the elongated magnet.

2. A displacement device according to claim 1, wherein the first part comprising magnetic strips is disposed in a stationary position.

3. A displacement device according to claim 1 or 2, wherein said elongated magnet is magnetised in a direction perpendicular to the conveying direction.

4. A component placement device comprising:
an X-beam extending in the X-direction;
at least one component pickup and placement unit, which is movable with respect to the X-bean;
a first Y-beam extending in the Y-direction;
a first slide, which is movable with respect to said first Y-bean;
a second Y-beam extending parallel to said first Y-beam;
a second slide, which is movable with respect to the second Y-beam,
wherein a first end of the X-beam is connected to the first slide and a second end of the X-beam is connected to the second slide, in such a manner that the X- and Y-beams are arranged in an H-configuration, said component placement device further comprising drive units for independently driving the slides with respect to the Y-beams,
wherein at least one drive unit comprises a linear motor, which comprises a first part comprising magnetic strips and a second part comprising a coil block, which parts are connected via a linear guide to one of the first or second Y-beam, said second part being movable in the Y-direction with respect to the first part,
said drive further comprising an elongated magnet connected to said second part, the elongated magnet being located on a side of the first part remote from the second part wherein at least a portion of the first part is located between the second part and the elongated magnet.

5. A component placement device according to claim 4, wherein the first part comprising magnetic strips is connected to the Y-beam, while the second part comprising the coil block and the elongated magnet are connected to the slide, with the elongated magnet being located on a side of the first part remote from the second part.

6. A component placement device according to claim 4 or 5, wherein said elongated magnet is magnetised in a Z-direction extending transversely to the X-direction and the Y-direction.

7. A component placement device according to claim 4, wherein the elongated magnet exerts a magnetic force on one of the first or second slides in a first direction, and the second part exerts a magnetic force on the one of the first or second slide in a second direction opposite the first direction.

* * * * *